(12) United States Patent
Jang et al.

(10) Patent No.: US 7,928,648 B2
(45) Date of Patent: Apr. 19, 2011

(54) YELLOW LIGHT EMITTING CE³⁺-ACTIVATED SILICATE PHOSPHOR WITH NEW COMPOSITION, MANUFACTURING METHOD THEREOF AND WHITE LEDS INCLUDING PHOSPHOR

(75) Inventors: Ho-Seong Jang, Daejeon (KR); Duk-Young Jeon, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 254 days.

(21) Appl. No.: 11/787,288

(22) Filed: Apr. 16, 2007

(65) Prior Publication Data
US 2007/0241666 A1    Oct. 18, 2007

(30) Foreign Application Priority Data

Apr. 17, 2006    (KR) .................. 10-2006-0034643

(51) Int. Cl.
*H01J 1/54*    (2006.01)
*C09K 11/08*    (2006.01)
(52) U.S. Cl. .................. 313/503; 313/498; 252/301.4 F
(58) Field of Classification Search .................. 313/498, 313/503; 252/301.4 F
See application file for complete search history.

(56) References Cited

U.S. PATENT DOCUMENTS

| | | | |
|---|---|---|---|
| 4,088,599 A * | 5/1978 | Suzuki et al. | 252/301.4 F |
| 7,781,953 B2 * | 8/2010 | Su | 313/487 |
| 7,838,896 B2 * | 11/2010 | Su et al. | 257/98 |
| 2005/0062417 A1 * | 3/2005 | Okuyama et al. | 313/582 |
| 2006/0261309 A1 * | 11/2006 | Li et al. | 252/301.4 F |
| 2007/0114548 A1 * | 5/2007 | Setlur et al. | 257/98 |

FOREIGN PATENT DOCUMENTS

WO    WO 2007035026 A1 *    3/2007

* cited by examiner

*Primary Examiner* — Bumsuk Won
*Assistant Examiner* — Nathaniel J Lee
(74) *Attorney, Agent, or Firm* — Clements Bernard PLLC; Gregory N. Clements

(57) ABSTRACT

The present invention relates to a phosphor and a white LED, more particularly, to a method for fabricating a yellow emitting Ce³⁺-activated silicate phosphor with a new composition represented as $(Sr_{1-y-z}M_yN_z)_{3-x}SiO_5:Ce^{3+}_x$, ($0<x\leq0.3$, M includes at least one selected from alkaline earth metals on the periodic table, $0\leq y\leq 1$, N is at least one selected from alkali metals on the periodic table and $0\leq z\leq 0.3$) and a preparation method thereof and an LED using the same. The phosphor according to the present invention shows a broad band emission when it is excited by the existing InGaN-based blue LED and GaN-based ultraviolet LED with long wavelength. The LED using the phosphor according to the present invention has a broad emission with a wide spectral range and good color purity and very high light emitting efficiency when is applied to a LED and a backlight source of a liquid crystal display.

10 Claims, 5 Drawing Sheets

YELLOW LIGHT EMITTING CE³⁺-ACTIVATED SILICATE PHOSPHOR WITH NEW COMPOSITION, MANUFACTURING METHOD THEREOF AND WHITE LEDS INCLUDING PHOSPHOR

BACKGROUND OF THE INVENTION

1. Field of the Invention

The present invention relates, generally, to $Ce^{3+}$-activated silicate phosphor and a white light emitting diode (LED) using the same, more particularly, to a phosphor composition showing a wider emission band than the existing phosphor and capable of obtaining a white light using an ultraviolet LED with a long wavelength as well as a blue LED, and a LED including the same and a fabrication method thereof.

2. Description of the Related Art

A white LED is one of the next generation light emitting devices which may replace the existing general lightings. The white LED is advantageous in showing less power consumption than the conventional light source and a high light emitting efficiency and a high brightness and further having a long lifetime and a rapid response compared to conventional light source.

Prior methods for fabricating a white LED are roughly divided into three: mixing red, green and blue LEDs with high brightness; coating red, green and blue light emitting phosphors on an ultraviolet LED with a long wavelength; and coating a yellow light emitting phosphor on a blue LED.

The first method for mixing red, green and blue LEDs is realized by using three different semiconductor thin films, i.e., one light emitting device using the three chips. It is disadvantageous since the process for manufacturing such a LED requires a great investment costs and the production cost is high.

The second method for coating red, green and blue light emitting phosphors on an ultraviolet LED with a long wavelength is disclosed in the International Patent Laid-open Publication No. WO98/039805. This is the best method for penetrating an ultraviolet light through a three coloring phosphor to produce a white light with three wavelength (red, green and blue light). However, heat is emitted from such a LED severely so that the light emitting efficiency is not good and a phosphor with good light emitting efficiency under irradiation of an ultraviolet light with a long wavelength has not been available yet. Nichia and Toyota Gosei just shows outputs with 2 to 3 mW. The reason is that a transparent resin to cover an ultraviolet LED with a long wavelength has not been developed yet and an organic resin is mainly used. But it absorbs the ultraviolet light and degrades the same, resulting in deteriorating the lifetime and the quality of LED.

The third method for fabricating a white LED by coating a yellow light phosphor on a blue LED has been the most widely researched. The structure of the white LED is simple and it can be easily fabricated. It is advantageous in that it is possible to obtain a white light with high brightness. This method is disclosed in International Patent Laid-open Publication No. WO 98/05078 filed by Nichia of Japan in detail and in "the Blue Laser Diode" by S. Nakamura (Springer-Verlag, P 216-219, 1997) in detail. The blue light emitted from the blue LED is absorbed by a phosphor of $Ce^{3+}$-doped aluminum garnet ($Y_2Al_5O_{12}:Ce^{3+}$;YAG:Ce) and the phosphor emits a yellow light in other words a blue light is combined with a yellow light to produce a white light. However, the YAG:Ce-based light emitting phosphor has a relatively weak light emitting intensity in a red spectral region and it is difficult to obtain good color rendering characteristics. It is also sensitive to a color temperature and is not appropriate as a backlight unit for LCD color backgrounds.

An $Eu^{2+}$ activated strontium silicate phosphor has been patented by Korea Research Institute of Chemical Technology (in Korea Patent Laid-open Publication No. 2004-0085039) but it has a peak wavelength of 570 nm and emits an orange light with a rather narrow emission bandwidth without a yellow light. Therefore, a white light cannot be obtained when coupled with a blue LED.

It is difficult to find a proper phosphor excited by the blue LED in order to emit a white light using the blue LED besides YAG:Ce or $Sr_3SiO_5:Eu^{2+}$. In other words, in the conventional method, YAG;Ce-based phosphor mainly realizes a white LED by combining with the blue LED. In order to solve the above problems, a new yellow light emitting phosphor besides YAG:Ce is desperately required.

SUMMARY OF THE INVENTION

Accordingly, the present invention has been made keeping in mind the above problems occurring in the related art, and an object of the present invention is to provide with a novel phosphor composition which shows a light emitting spectrum with a broader emission band than the existing phosphor to obtain a white light by using an ultraviolet LED with a long wavelength as well as a blue LED.

Another object of the present invention is to provide a LED including the novel phosphor composition excited by a light output from the existing blue LED chip and an ultraviolet LED with a long wavelength.

In order to attain the above objects, a novel phosphor composition according to the present invention is shown in $$(Sr_{1-y-z}M_yN_z)_{3-x}SiO_5:Ce^{3+}{}_x.$$

Wherein, $0<x\leq0.3$, $0\leq y\leq 1$, M is selected from alkaline earth metals on the periodic table, $0\leq z\leq 0.3$ and N is selected from alkali metals on the periodic table.

It is preferable that a light emitted from the phosphor according to the present invention has a wavelength range of 450 to 750 nm.

In addition, the present invention provides a LED comprising a LED chip and a phosphor with the below composition excited by a light output from the LED chip, $$(Sr_{1-y-z}M_yN_z)_{3-x}SiO_5:Ce^{3+}{}_x.$$

Wherein, $0<x\leq0.3$, $0\leq y\leq 1$, M is selected from alkaline earth metals on the periodic table, $0\leq z\leq 0.3$ and N is selected from alkali metals on the periodic table.

It is preferable that the LED chip be a blue LED chip or near ultraviolet LED chip.

It is preferable that the LED chip have a dominant wavelength of 400 to 470 nm.

It is preferable that the light emitted by a phosphor have a wavelength range of 450 to 750 nm.

In addition, the present invention provides with a method for fabricating a novel phosphor composition as below, $$(Sr_{1-y-z}M_yN_z)_{3-x}SiO_5:Ce^{3+}{}_x, \text{ and}$$

the method comprising: mixing strontium carbonate ($SrCO_3$), carbonate or oxide of alkaline earth metals (M), carbonate, fluorine compound or chlorine compound of alkali metals (N), silica ($SiO_2$) and cerium oxide ($CeO_2$); drying the mixture; and heat-treating the dried mixture in a reducing atmosphere;

Wherein, $0<x\leq0.3$, $0\leq y\leq 1$, M is selected from alkaline earth metals on the periodic table, $0\leq z\leq 0.3$ and N is selected from alkali metals on the periodic table.

It is preferable that the drying method be performed at 80 to 150° C.

It is preferable that the heat treatment be performed at 800 to 1600° C.

It is preferable that the reduction atmosphere be provided by supplying a nitrogen mixture gas whose hydrogen content is 2 to 25% by volume on basis of the volume of the mixture gas.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
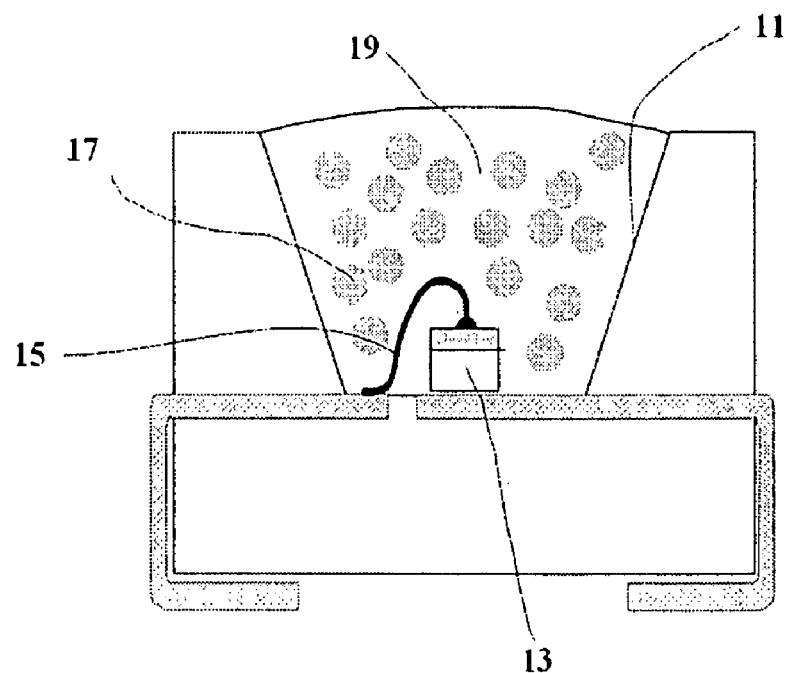
FIG. 1 is a schematic view of a LED using the $Ce^{3+}$-activated silicate-based phosphor according to the present invention.

Hereinafter, the contents of the present invention now will be described in detail. The novel phosphor composition according to the present invention is very useful in fabricating a LED, especially a white LED. The novel phosphor composition according to the present invention is made in the formula as follows,

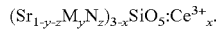
$(Sr_{1-y-z}M_yN_z)_{3-x}SiO_5:Ce^{3+}_x$.

Wherein, $0<x\leq0.3$, $0\leq y\leq1$, M includes at least one element selected from alkaline earth metals on the periodic table, for example, Mg, Ca and Ba, $0\leq z\leq0.3$ and N includes at least one atom selected from alkali metals on the periodic table, for example, Li, Na, K and Rb.

In the phosphor followed in the above composition, Sr and Si constitute a host lattice and $Ce^{3+}$ is operated as an activator. At this time, if the amount of Ce is less than 0.001, it is not sufficient for an activator. If it is greater than 0.3, the brightness is decreased to be undesirable in accordance with a concentration quenching effect.

In the above phosphor composition according to the present invention, y can have 0, and Sr can be replaced by an alkali earth element like Mg, Ca and Ba, etc., if required. At this time, if M is Ba, it is preferable that $0<y\leq0.9$ in the composition formula in view of ion replacements because the ionic radius of Ba is not much different from that of Sr. If M is Ca or Mg, it is preferable that $0<y\leq0.5$ in the composition formula because the difference in ion radius from Sr is greater than the case that M is Ba and the phase of the host lattice is not easily formed.

In addition, z can have 0 and if required, $Sr^{2+}$ can be replaced by a monovalent alkali metal element in order to meet a charge balance since $Ce^{3+}$ replaces $Sr^{2+}$. At this time, if N is Li or Na, it is preferable that $0<z\leq0.2$ in the composition formula because a difference in ionic radius from Sr is large to be undesirable in forming the phase of the host material. If N is K, it is preferable that $0<z\leq0.3$ in the composition formula. It is not preferable that it is replaced too much, because a large difference in ionic radius occurring within a lattice causes a distortion in the structure of the host material.

The novel phosphor composition according to the present invention can be fabricated by the following method.

In the preferred embodiment of the present invention, the raw materials of the phosphor are strontium carbonate ($SrCO_3$), silica ($SiO_2$) and cerium oxide ($CeO_2$). As described above, Sr can be replaced by alkaline earth elements like Mg, Ca and Ba, etc., if required.

The $Ce^{3+}$-activated silicate-based phosphor can be obtained through the following step: mixing the main raw materials of strontium carbonate ($SrCO_3$), carbonate or oxide of alkaline earth metals (M), carbonate, fluorine compound or chlorine compound of alkali metals (N), silica ($SiO_2$) and cerium oxide ($CeO_2$), drying the mixture and heat-treating the dried mixture in a reducing atmosphere.

The above processes now will be described in detail.

First, strontium carbonate ($SrCO_3$), carbonate or oxide of alkaline earth metals (M), carbonate, fluorine compound or chlorine compound of alkali metals (N), silica ($SiO_2$) and cerium oxide ($CeO_2$) are weighed and mixed in a predetermined solvent.

In detail, the materials are weighed in a predetermined proportion to a desired composition and ethanol or acetone can be used as the solvent for an efficient mixing. In addition, the materials are mixed to achieve a uniform composition by a mixer like a ball mill or an agate mortar with the solvent.

In order to obtain a uniform composition, the materials are mixed adequately and the mixture is dried in an oven. Herein, the temperature for drying is set to 80 to 150° C. and the time for drying is set to 1 to 24 hours. Next, the dried mixture is put in an alumina tube with high purity and the alumina tube is put in an electric furnace and heat-treated in a reducing atmosphere of a $N_2$ gas mixed with hydrogen.

Here, if the temperature for heat treatment is below 800° C., a single phase of the $Ce^{3+}$-activated strontium silicate is not perfectly produced and its light emitting efficiency is reduced. If the temperature exceeds 1600° C., the brightness can be remarkably decreased due to an overreaction. Accordingly, it is preferable that the temperature for heat treatment be 800° C. to 1600° C. and the time for heat treatment is 1 to 36 hours.

A mixed gas of nitrogen and hydrogen is used as the mixed gas for a reducing atmosphere and the hydrogen content to the volume of the mixed gas is 2 to 25 volume (v/v) %.

After firing, it is cooled to the temperature at about room temperature and adequately grinded to obtain the phosphor of the powder with the diameter of 5 to 20 μm. The obtained phosphor is coated on a blue LED having a wavelength of 420 to 470 nm or an ultraviolet LED chip with a long wavelength of 400 to 420 nm made of GaN or ZnO. Preferably, a phosphor of 1 to 40 wt % is mixed with an epoxy resin or a silicone-based resin and coated on a LED chip and hardened at 130 to 200° C. to fabricate a white LED of the present invention.

FIG. 1 shows the structure of a white LED using the blue LED and the ultraviolet LED with a long wavelength according to the present invention. Referring to FIG. 1, the white LED using the blue LED or the ultraviolet LED with a long wavelength according to the present invention includes a reflection cup (11), an InGaN-based LED chip (13) provided on the reflection cup (11) (GaN-based LED in case of an ultraviolet LED with a long wavelength), a phosphor (17) excited by a light output from the LED chip (13), an electrode line (15) connected to the LED chip (13) and a light transparent epoxy (19) encapsulating the LED chip (13). In detail, the InGaN-based LED chip (13) is connected to an external power source by the electrode line (15). In addition, a phosphor (17) excited by a light output from the InGaN-based LED chip (13) is mixed with the epoxy resin (19) to be formed on outer side of a LED chip (13). The constitution of the LED according to the present invention is not limited to the above and addition, modification and deletion of the constituting elements according to the prior art are possibly made. In addition, the phosphor (17) can be mixed with a silicone-based resin besides epoxy resin and can constitute a white LED by a method for molding the vicinity of the LED chip (13). By the above configuration, a long wavelength ultraviolet LED-based white light emit diode can be formed. Herein, a silicone-based resin besides an epoxy resin can be used as a transparent resin. Moreover, the phosphor (17) is formed on outside of the LED chip (13) to make a light output from a light emitting layer of the LED chip (13) be used as an excitation light source of the phosphor (17).

To describe the process to obtain a white light in detail, a blue light output from the LED chip (13) is made to transmit the $Ce^{3+}$-activated strontium silicate-based phosphors. Herein, some light is used to excite a yellow-emitting phosphor formed of the $Ce^{3+}$-activated strontium silicate-based phosphor to obtain yellow light and the other light is transmitted itself. Accordingly, as described above, a yellow light emitted from the yellow phosphor which is excited by blue light is overlapped with a blue light which transmits the yellow phosphor itself to generate a white light.

Hereinafter, the present invention will be described in detail through the embodiments, which are set forth to illustrate the present invention more concretely. It will be apparent to those skilled in the technology that the scope of the present invention is not limited by the embodiments.

Embodiment 1

Fabricating $Ce^{3+}$-activated strontium silicate-based phosphors

In the experiments, in order to experiment within the above embodiments, strontium carbonate ($SrCO_3$), silica ($SiO_2$), cerium oxide ($CeO_2$) and lithium carbonate ($Li_2CO_3$) are weighed in the mole ratio of 2.94:1:0.03:0.03 and ethanol is used as a solvent for mixing them. The materials are mixed to obtain a uniform composition by a mixer like a ball mill or an agate mortar with the solvent. Herein, the temperature for drying is set to 120° C. and the time for drying is set to 24 hours in the oven, and the temperature for heat treatment is set to 1350° C. and the time for heat treatment is set to 36 hours. In order to compose a reducing atmosphere, a mixed $N_2$ gas with hydrogen of 2 to 25 volume % is used. Through the experimental procedure, the $Ce^{3+}$-activated strontium silicate yellow phosphor having the chemical formula of $Sr_{2.94}Li_{0.03}SiO_5:Ce^{3+}_{0.03}$ is obtained and InGaN-based LED having a dominant wavelength of 460 nm is used to fabricate a white LED as shown in FIG. 1.

Figure 2:
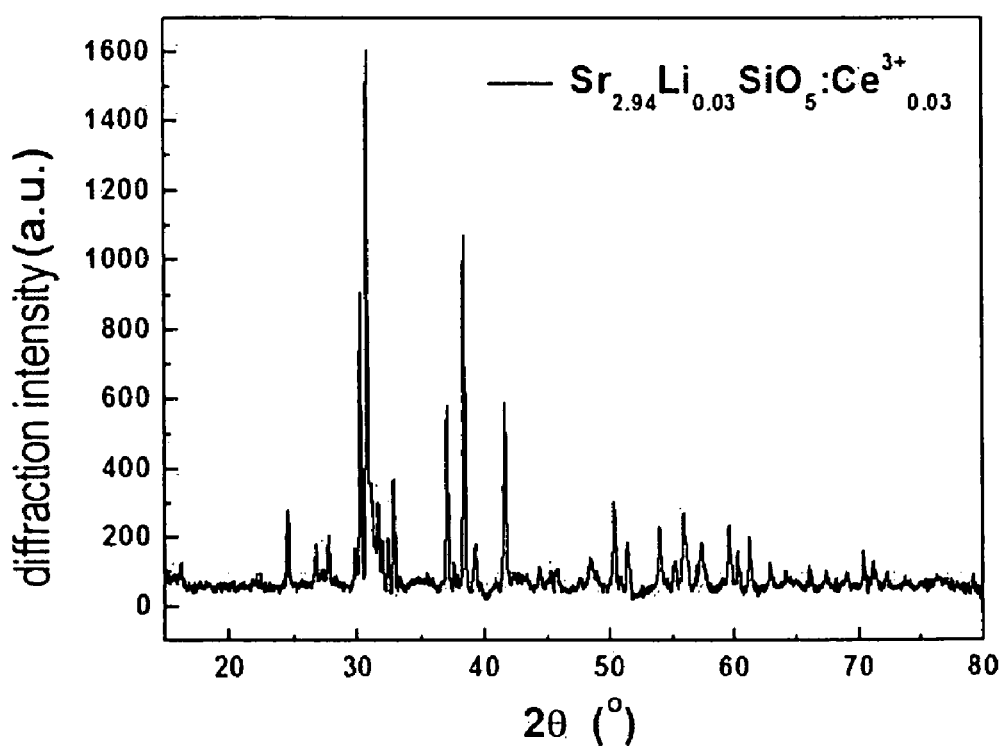
FIG. 2 shows an x-ray diffraction (XRD) pattern of the $Ce^{3+}$-activated silicate-based phosphor according to the present invention.

FIG. 2 shows a X-ray diffraction pattern of a yellow light emitting $Ce^{3+}$-activated strontium silicate phosphor according to the present invention. As confirmed in FIG. 2, the phosphor according to the present invention can form the strontium silicate phase of a tetragonal phase.

Figure 3:
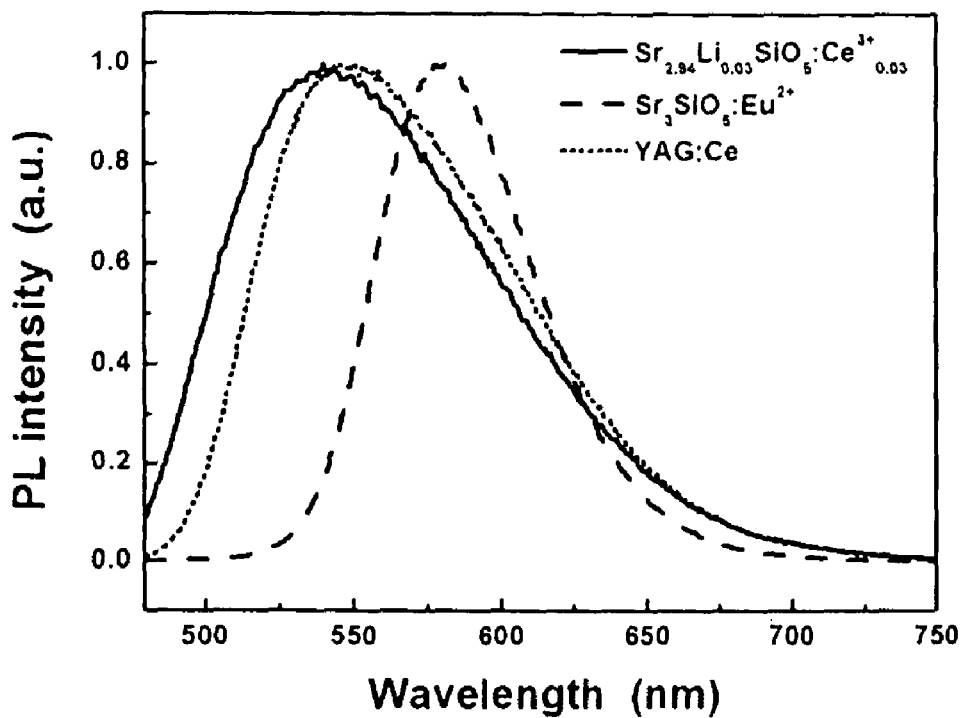
FIG. 3 shows a photoluminescence (PL) spectra of the $Ce^{3+}$-activated silicate-based phosphor according to the present invention, YAG:Ce and an $Eu^{2+}$-activated $Sr_3SiO_5$ phosphor.

FIG. 3 shows the PL spectra of a yellow light emitting $Ce^{3+}$-activated silicate yellow phosphor, according to the present invention, an orange light emitting $Eu^{2+}$-activated strontium silicate phosphor, and YAG:Ce-based phosphor in comparison examples. Whereas the orange light emitting $Eu^{2+}$-activated strontium silicate phosphor lacks a light emitting intensity in a green spectral region and white LEDs fabricated by using $Eu^{2+}$-activated silicate phosphor do not have good color rendering properties, the yellow light emitting $Ce^{3+}$-activated silicate-based phosphors according to the present invention shows a spectrum with a wide bandwidth to have an excellent light emitting intensity from a green region to a red region.

Figure 4:
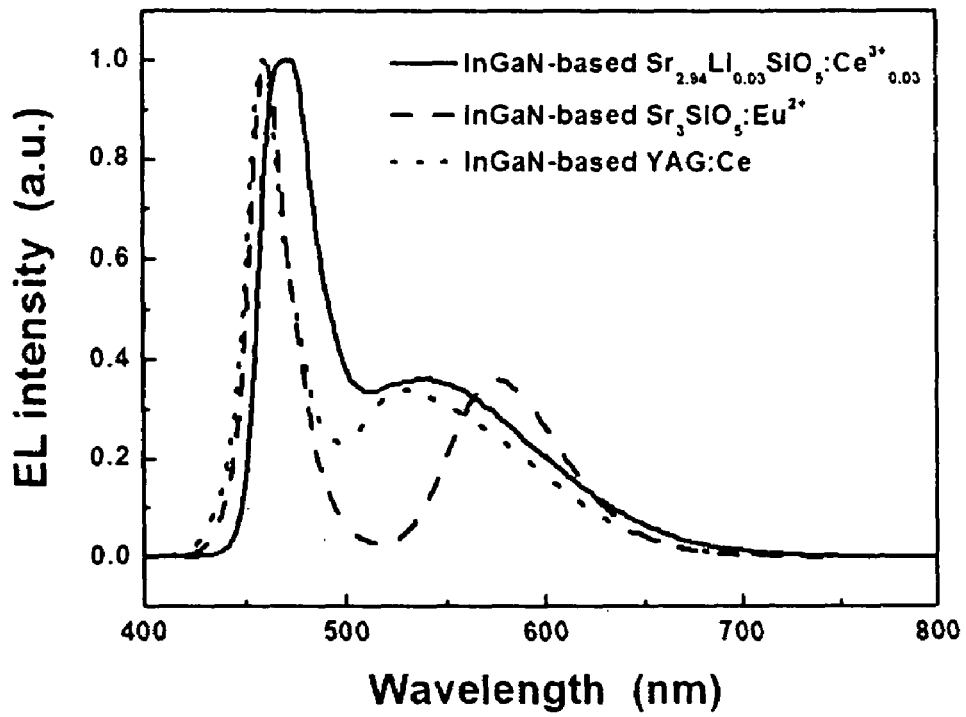
FIG. 4 shows an electroluminescence (EL) spectra of LEDs combining the $Ce^{3+}$-activated silicate-based phosphor with a blue LED according to the present invention.

FIG. 4 shows an EL spectra of white LEDs fabricated by coating a yellow light emitting $Ce^{3+}$-activated strontium silicate phosphor, the existing YAG:Ce-based phosphor and an $Eu^{2+}$-activated strontium silicate-based phosphor on InGaN chip, respectively. Herein, the solid line shows a spectrum of a white LED fabricated using a yellow light emitting $Sr_{2.94}Li_{0.03}SiO_5:Ce^{3+}_{0.03}$ according to the experimental example and a dotted line shows a spectrum of a LED using the existing InGaN chip and YAG:Ce.

Referring to FIG. 4, the light emitted from $Ce^{3+}$-activated strontium silicate phosphor according to the present invention shows the spectrum of a wide bandwidth of 460 to 750 nm and the white LED fabricated using the phosphor showed the spectrum of a wide bandwidth of 420 to 730 nm and the brightness is improved greatly when compared with a comparison example. Accordingly, if $Ce^{3+}$-activated strontium silicate phosphor is used according to the present invention, the color purity can be improved, and can be used as a highly efficient phosphor if it is applied to a blue LED, an ultraviolet LED with a long wavelength, or an active matrix liquid crystal display.

Embodiment 2

Fabricating white LED using ultraviolet LED with long wavelength and $Ce^{3+}$-activated strontium silicate-based phosphor As shown in FIG. 1, a near ultraviolet LED-based white LED is fabricated by using a GaN-based near ultraviolet LED (herein, near ultraviolet LED is the same as ultraviolet LED with a long wavelength) having a dominant wavelength of 405 nm with $Ce^{3+}$-activated strontium silicate-based phosphor as in the Embodiment 1.

Figure 5:
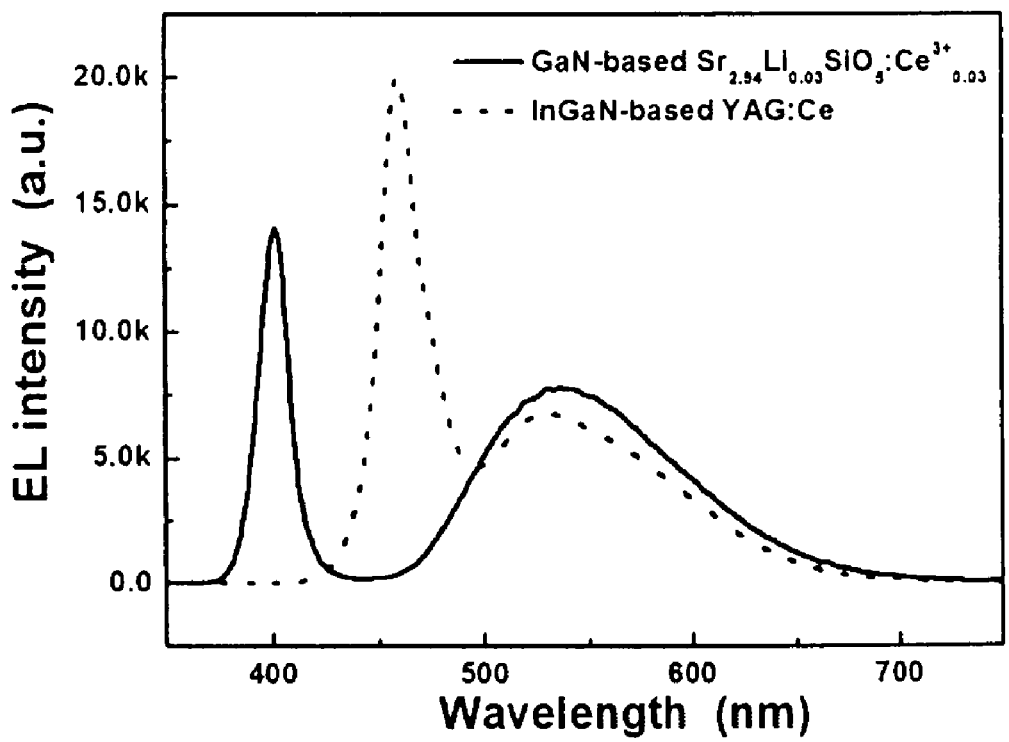
FIG. 5 shows an EL spectra of a white LED combining the $Ce^{3+}$-activated silicate-based phosphor with an ultraviolet LED with a long wavelength according to the present invention.

In FIG. 5, a white LED chip fabricated by using a $Ce^{3+}$-activated strontium silicate-based phosphor ($Sr_{2.94}Li_{0.03}SiO_5:Ce^{3+}_{0.03}$) of the present invention is compared with the white LED using the existing InGaN chip and YAG:Ce.

Herein, the solid line shows a spectrum of a white LED fabricated using a $Ce^{3+}$-activated strontium silicate-based phosphor ($Sr_{2.94}Li_{0.03}SiO_5:Ce^{3+}_{0.03}$) according to the experimental example and the dotted line shows a spectrum of a LED using the YAG:Ce-based phosphor. In a case that GaN— or ZnO-based ultraviolet LED chip with a long wavelength is used, [0] the YAG:Ce-based phosphor barely absorbs a light and emits a yellow light and therefore a white light cannot be obtained. Contrary to this, the $Ce^{3+}$-activated strontium silicate-based phosphor according to the present invention showed good excitation characteristics under 405 nm to emit a yellow light in a wide spectral region. Therefore, it showed a good white light by combining with an ultraviolet LED with a long wavelength. The phosphor according to the present invention shows an emission with a wide spectral range of 450 to 750 nm and the dominant wavelength is widely changed. Therefore, it is possible to improve a color purity and can be applied as a highly efficient yellow light emitting material to an ultraviolet LED with a long wavelength and an active matrix liquid crystal display.

Figure 6:
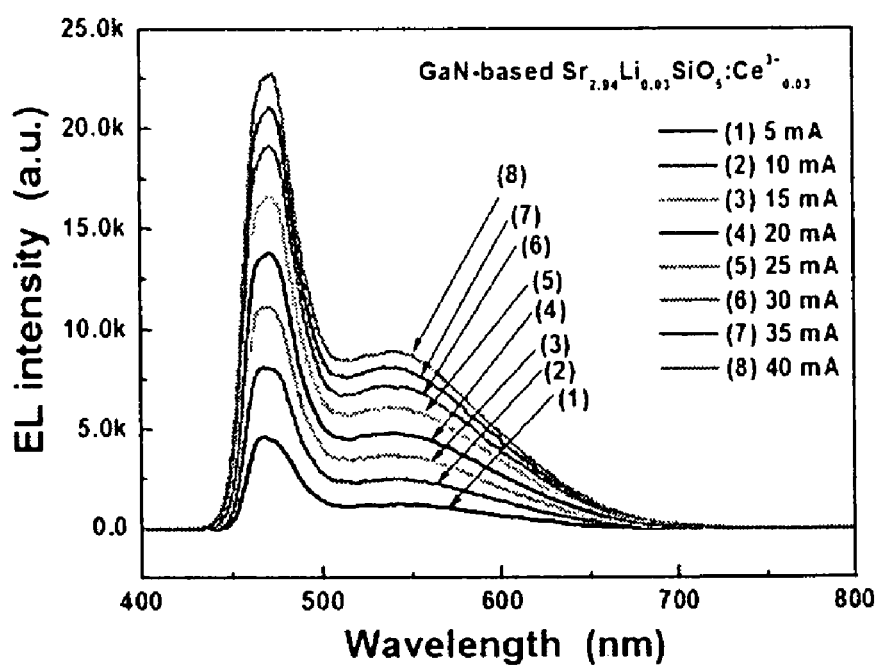
FIG. 6 shows an EL spectra of a white LED combining the $Ce^{3+}$-activated strontium silicate with a LED with a dominant wavelength of 460 nm at various forward currents.

FIG. 6 shows EL spectra of a white LED fabricated with a blue LED with a dominant wavelength of 460 nm and the $Ce^{3+}$-activated strontium silicate-based phosphor according to the present invention under various forward currents. As shown in FIG. 6, they have good characteristics in that as an applied current is increased, the intensity of emitted light is increased in both the LED and the phosphor according to the present invention.

Embodiment 3

Figure 7:
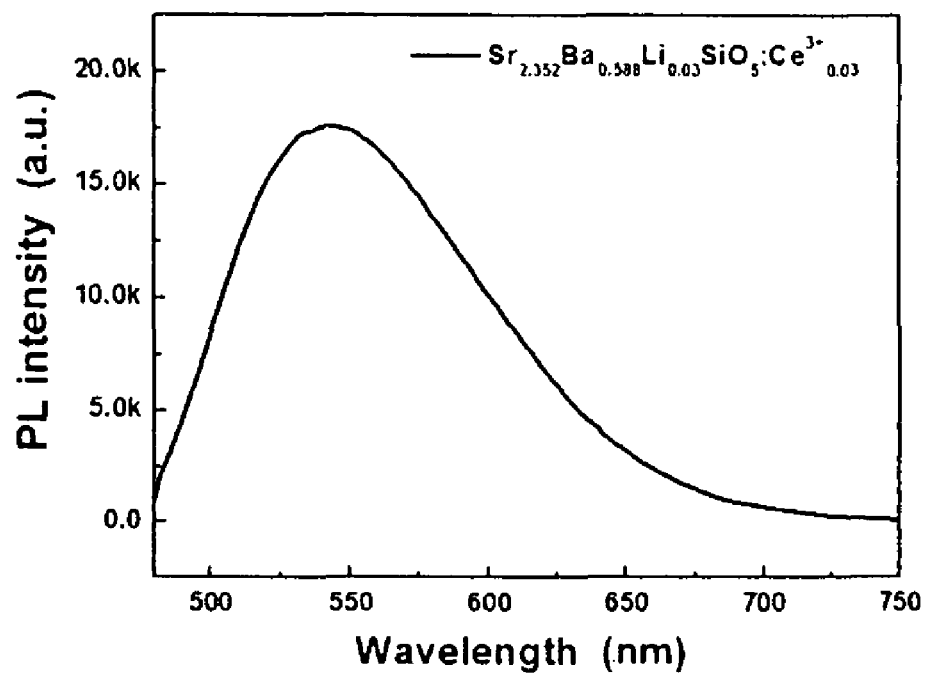
FIG. 7 shows a PL spectrum of the $Ce^{3+}$-activated silicate-based phosphor of which M is Ba (y=0.2) under an excitation of 450 nm.
Figure 8:
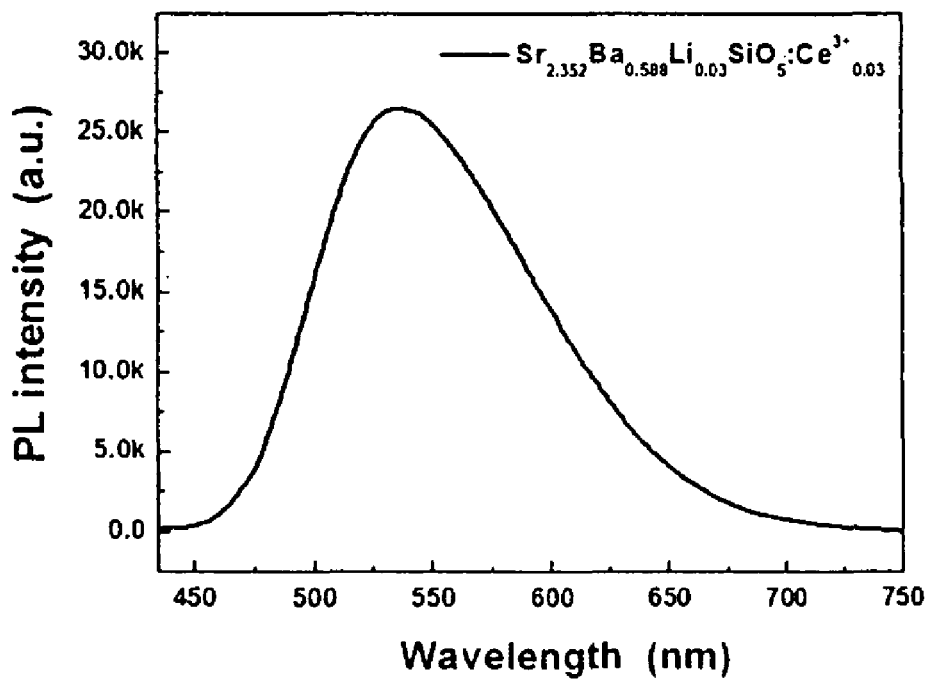
FIG. 8 shows a PL spectrum of the $Ce^{3+}$-activated silicate-based phosphor of which M is Ba (y=0.2) under an excitation of 405 nm.

In the case that M is Ba (y=0.2) in the composition of the phosphor according to the present invention, the materials are weighed in a mol ratio of strontium carbonate ($SrCO_3$), barium carbonate ($BaCo_3$), silica ($SiO_2$), cerium oxide ($CeO_2$) and lithium carbonate ($Li_2CO_3$) in 2.352:0.588:1:0.03:0.03 and the phosphor is synthesized by the method described in the Embodiment 1 and its emission spectrum is shown in FIGS. 7 & 8. As shown in FIG. 7, $Sr_{2.352}Ba_{0.588}Li+_{0.03}SiO_5:Ce^{3+}_{0.03}$ shows a broad and strong yellow emission with the main wavelength of 540 nm when it is excited by a blue light like the case where y=0. Accordingly, it is confirmed that this phosphor can be also applied to a white LED which emits a white light when it is coated on a blue LED. In addition, FIG. 8 shows PL spectrum of this phosphor when it is excited by an ultraviolet light with a long wavelength of 405 nm, and in this case it also shows a strong yellow light emitting band with a wavelength range of 450 nm to 750 nm. Accordingly, it is confirmed that this phosphor can be also applied to a white LED which emits a white light when it is coated on a long wavelength ultraviolet LED.

Embodiment 4

Figure 9:
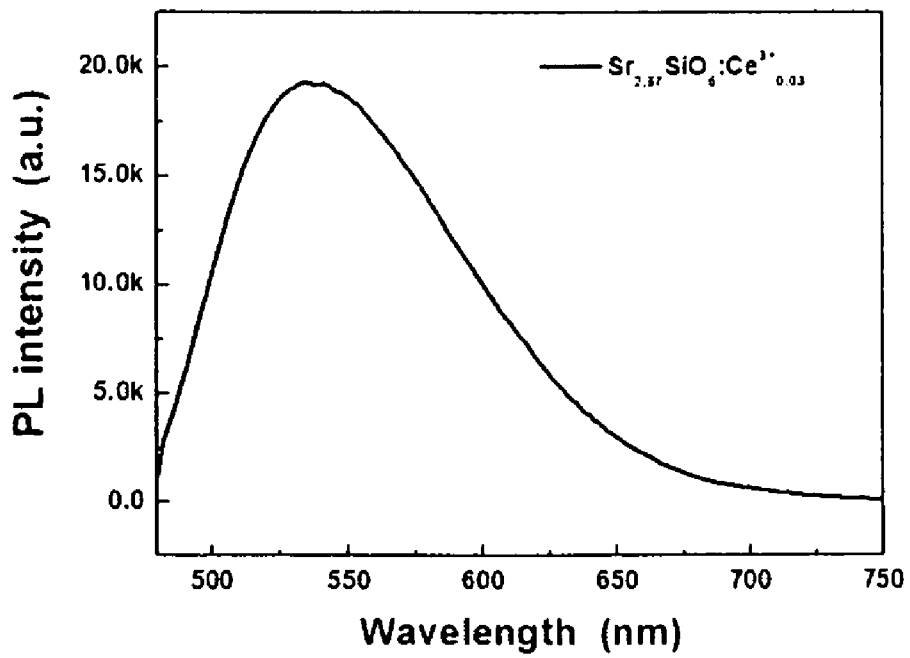
FIG. 9 shows a PL spectrum of the $Ce^{3+}$-activated silicate-based phosphor of which N does not exist (z=0) under an excitation of 450 nm.
Figure 10:
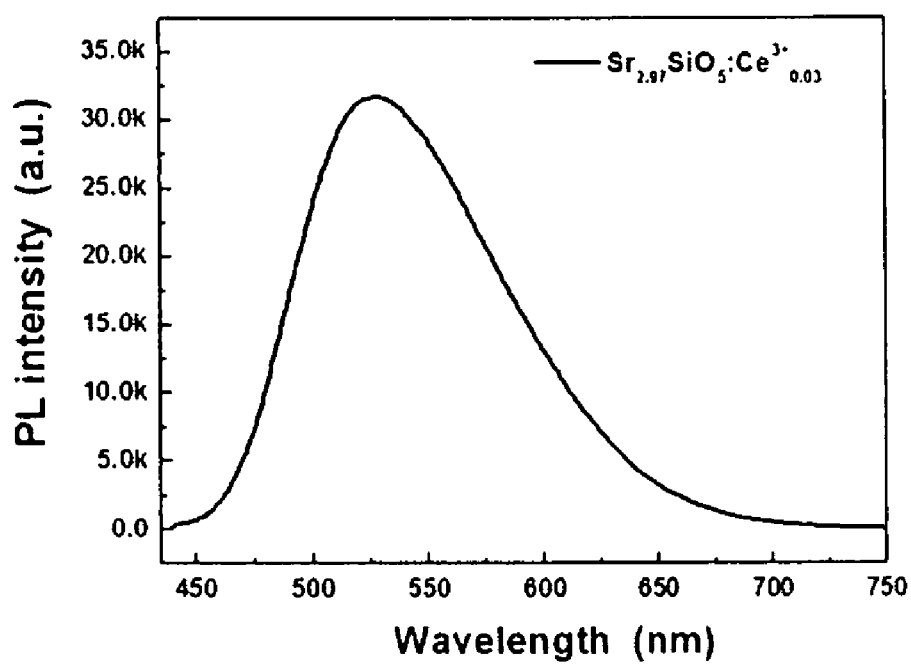
FIG. 10 shows a PL spectrum of the $Ce^{3+}$-activated silicate-based phosphor of which N does not exist (z=0) under an excitation of 405 nm.

In the case that N is omitted in the composition of the phosphor according to the present invention, the raw materials are weighed in a mol ratio of strontium carbonate ($SrCO_3$), silica ($SiO_2$) and cerium oxide in 2.97:1:0.03 and the phosphor is synthesized by the method described in the Embodiment 1 and its light emitting spectrum is shown in FIGS. 9 & 10. FIG. 9 shows a broad and strong yellow emission with the main wavelength of 540 nm when this phosphor is excited by a blue light like the case where y=0. Accordingly, it is confirmed that this phosphor can be also applied to a white LED which emits a white light when it is coated on a blue LED. In addition, FIG. 10 shows PL spectrum of this phosphor when it is excited by an ultraviolet light with a long wavelength of 405 nm, and in this case it also shows a strong yellow light emitting band with a wavelength range of 450 nm to 750 nm. Accordingly, it is confirmed that this phosphor can be also applied to a white LED which emits a white light when it is coated on a long wavelength ultraviolet LED.

As described above in detail, according to the present invention, the $Ce^{3+}$-activated strontium silicate-based yellow light emitting phosphor can be synthesized and it is possible to obtain a phosphor having a broad emission band, and capable of performing an effective light emission using a blue LED as an excitation source.

In addition, it is confirmed that a light with a high brightness is also emitted from the phosphor according to the present invention when it is applied to an ultraviolet LED with a long wavelength and a white light is generated from the white LED fabricated with an ultraviolet LED with a long wavelength and the phosphor according to the present invention.

The phosphor according to the present invention has a very high light emitting efficiency when applied to a blue LED, an ultraviolet LED with a long wavelength and a backlight source of a liquid crystal display so that it is especially effective when used as a backlight source for liquid crystal display such as a lighting device, a notebook and a cellular phone.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A phosphor composition as below, $(Sr_{1-z}N_z)_{3-x}SiO_5:Ce^{3+}_x$

Wherein, $0<x\leq0.3$, $0<z\leq0.3$ and N is selected from alkali metals on the periodic table.

2. The phosphor composition of claim 1, wherein a light emitted from a phosphor has a wavelength range of 450 to 750 nm.

3. A LED comprising a LED chip and a phosphor with the composition below excited by a light output from the LED chip, $(Sr_{1-z}N_z)_{3-x}SiO_5:Ce^{3+}_x$ Wherein, $0<x\leq0.3$, $0<z\leq0.3$ and N is selected from alkali metals on the periodic table.

4. The LED of claim 3, wherein the LED chip is a blue LED chip or an ultraviolet LED chip.

5. The LED of claim 3, wherein the LED chip has a dominant wavelength range of 400 to 470 nm.

6. The LED of claim 3, wherein a light emitted from a phosphor has a wavelength range of 450 to 750 nm.

7. A method for manufacturing a phosphor composition as below, $(Sr_{1-z}N_z)_{3-x}SiO_5:Ce^{3+}_x$, and the method comprising:
   mixing strontium carbonate ($SrCO_3$), carbonate, fluorine compound or chlorine compound of alkali metals (N), silica ($SiO_2$) and cerium oxide ($CeO_2$); drying the mixture; and heat-treating the dried mixture in a reducing atmosphere,
   Wherein, $0<x\leq0.3$, $0<z\leq0.3$ and N is selected from alkali metals on the periodic table.

8. The method of claim 7, wherein the drying method is performed at 80 to 150° C.

9. The method of claim 7, wherein the heat treatment is performed at 800 to 1600° C.

10. The method of claim 7, wherein a reducing atmosphere is provided by supplying a nitrogen mixture gas whose hydrogen content is 2 to 25% by volume on the basis of the volume of a mixture gas.

* * * * *